(12) United States Patent
Marukame et al.

(10) Patent No.: US 8,681,033 B2
(45) Date of Patent: Mar. 25, 2014

(54) ANALOG-TO-DIGITAL CONVERTER INCLUDING DIFFERENTIAL PAIR CIRCUIT

(75) Inventors: Takao Marukame, Tokyo (JP); Tetsufumi Tanamoto, Kanagawa (JP); Atsuhiro Kinoshita, Kanagawa (JP); Tomoaki Inokuchi, Kanagawa (JP); Masamichi Suzuki, Tokyo (JP); Yoshiaki Saito, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/535,118

(22) Filed: Jun. 27, 2012

(65) Prior Publication Data

US 2013/0076551 A1 Mar. 28, 2013

(30) Foreign Application Priority Data

Sep. 22, 2011 (JP) ................................. 2011-208034

(51) Int. Cl.
*H03M 1/34* (2006.01)

(52) U.S. Cl.
USPC .......................................... 341/158; 341/155

(58) Field of Classification Search
USPC .................. 341/155, 172, 159, 139, 122, 154
See application file for complete search history.

(56) References Cited

U.S. PATENT DOCUMENTS

| | | | |
|---|---|---|---|
| 4,939,518 A * | 7/1990 | Hotta et al. .................... | 341/159 |
| 6,373,423 B1 * | 4/2002 | Knudsen ....................... | 341/159 |
| 6,436,526 B1 | 8/2002 | Odagawa et al. | |
| 6,906,584 B1 * | 6/2005 | Moffat et al. .................. | 330/69 |
| 7,126,511 B2 * | 10/2006 | Draxelmayr et al. ......... | 341/136 |
| 7,394,417 B2 * | 7/2008 | Naka et al. .................... | 341/139 |
| 7,777,565 B2 * | 8/2010 | Tanizawa ....................... | 330/69 |
| 7,902,860 B2 * | 3/2011 | Yamamoto et al. ............ | 326/32 |
| 8,456,237 B2 * | 6/2013 | Huang et al. .................. | 330/282 |
| 2002/0058158 A1 | 5/2002 | Odagawa et al. | |
| 2009/0045995 A1 * | 2/2009 | Nozawa et al. ............... | 341/158 |

FOREIGN PATENT DOCUMENTS

JP  09-107289  4/1997
KR  10-2001-0007428  1/2001

OTHER PUBLICATIONS

Notice of Preliminary Rejection for Korean Patent Application No. 10-2012-71028 dated Aug. 23, 2012, 4 pgs.

* cited by examiner

*Primary Examiner* — Peguy Jean Pierre
(74) *Attorney, Agent, or Firm* — Finnegan, Henderson, Farabow, Garrett & Dunner, L.L.P.

(57) ABSTRACT

According to an embodiment, an analog-to-digital converter includes a voltage generating unit to generate comparative voltages; and comparators. Each comparator compares any one of the comparative voltages with an analog input voltage and output a digital signal. Each comparator includes a differential pair circuit to detect a potential difference between two inputs. The differential pair circuit includes first and second circuit portions. The first circuit portion includes a first transistor having a gate to which one input is supplied; and a resistor connected in series with the first transistor. The second circuit portion includes a second transistor having a gate to which the other input is supplied and forms a differential pair with the first transistor; and a variable resistor connected in series with the second transistor. The variable resistor includes variable resistive elements each having a resistance value variably set according to a control signal.

9 Claims, 16 Drawing Sheets

| INPUT | | $2^2$ | $2^1$ | $2^0$ | OUTPUT |
|---|---|---|---|---|---|
| DECIMAL | BINARY | | | | |
| 0 | 000 | 4 | 2 | 1 | 7 |
| 1 | 001 | 4 | 2 | 2 | 8 |
| 2 | 010 | 4 | 4 | 1 | 9 |
| 3 | 011 | 4 | 4 | 2 | 10 |
| 4 | 100 | 8 | 2 | 1 | 11 |
| 5 | 101 | 8 | 2 | 2 | 12 |
| 6 | 110 | 8 | 4 | 1 | 13 |
| 7 | 111 | 8 | 4 | 2 | 14 |

FIG.19
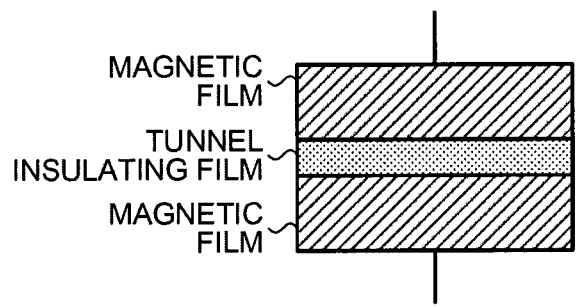
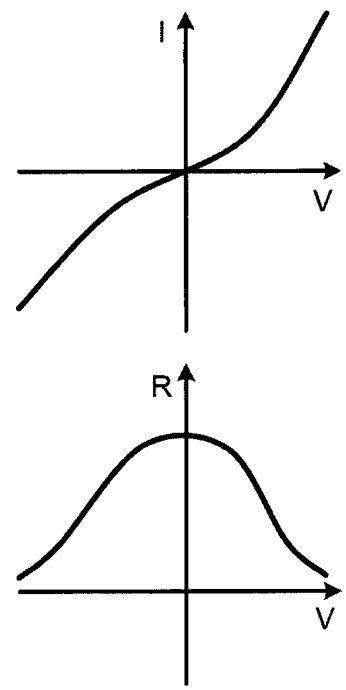
FIG.20
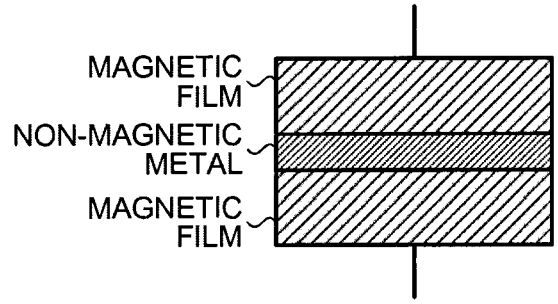
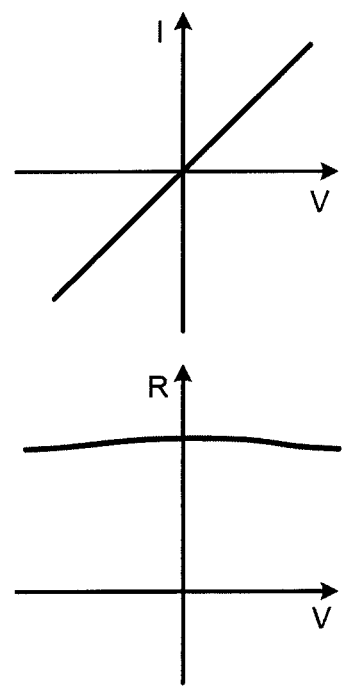

ANALOG-TO-DIGITAL CONVERTER INCLUDING DIFFERENTIAL PAIR CIRCUIT

CROSS-REFERENCE TO RELATED APPLICATIONS

This application is based upon and claims the benefit of priority from Japanese Patent Application No. 2011-208034, filed on Sep. 22, 2011; the entire contents of which are incorporated herein by reference.

FIELD

Embodiments described herein relate generally to an analog-to-digital converter.

BACKGROUND

Analog-to-digital converters (AD converters) are roughly classified into three types of a successive-approximation type, a parallel comparison type, and a delta sigma (ΔΣ) type. Of these, the parallel comparison type is also called a flash type, and can obtain a digital value in a single comparison using $(2^n-1)$ comparative voltages and $(2^n-1)$ comparators for dividing a full scale of the analog signal into $2^n$ sections. For this reason, a parallel comparison type AD converter operates at highest speed.

However, the parallel comparison type is known to have a problem that a circuit size is large. The reason is as follows. An AD converter includes three basic elements of a resistor ladder for generating a comparative voltage, a comparator group, and an encoder. The conversion accuracy of the AD converter is determined depending on the accuracy of the resistor ladder and the resolution of the comparator, and the accuracy or the resolution is improved as the circuit area increases.

That is, in the parallel comparison type, the circuit size increases in exchange for an improvement in the conversion accuracy. In other words, it is difficult to achieve high resolution with a small circuit area.

Here, the comparator includes a differential pair for detecting a potential difference between two inputs, and in order to achieve high resolution, a variation in a threshold value of input transistors forming the differential pair needs to be suppressed. The accuracy of the threshold value differs according to a generation of a CMOS fabrication technique, and it is desirable to use a higher-level technique. Thus, the number of bits of the resolution of the parallel comparison type AD converter is basically limited to the range of accuracy of semiconductor microfabrication technique, and the circuit area and the resolution are in a trade-off relation.

BRIEF DESCRIPTION OF THE DRAWINGS

FIG. 19 is a diagram illustrating an example of an I-V characteristic of an MTJ element;

FIG. 20 is a diagram illustrating an example of an I-V characteristic of a GMR element;

DETAILED DESCRIPTION

According to an embodiment, an analog-to-digital converter includes a voltage generating unit and a plurality of comparators. The voltage generating unit is configured to divide an externally applied reference voltage by a plurality of resistors to generate a plurality of comparative voltages. Each of the plurality of comparators is configured to compare any one of the plurality of comparative voltages with an analog input voltage and output a digital signal based on a result of a comparison between the comparative voltage and the analog input voltage. Each of the plurality of comparators includes a differential pair circuit configured to detect a potential difference between two inputs of the comparative voltage and the analog input voltage. The differential pair circuit includes a first circuit portion and a second circuit portion. The first circuit portion includes a first input transistor having a gate to which one input is supplied; and a resistor which is connected in series with the first input transistor. The second circuit portion includes a second input transistor that has a gate to which the other input is supplied and forms a differential pair with the first input transistor; and a variable resistor which is connected in series with the second input transistor. The variable resistor includes a plurality of variable resistive elements which are connected in series, and each of the variable resistive elements has a resistance value variably set according to a control signal.

Hereinafter, embodiments of an analog-to-digital converter (referred to as an "AD converter" in the following description) according to an embodiment will be described in detail with reference to the accompanying drawings.

Figure 1:
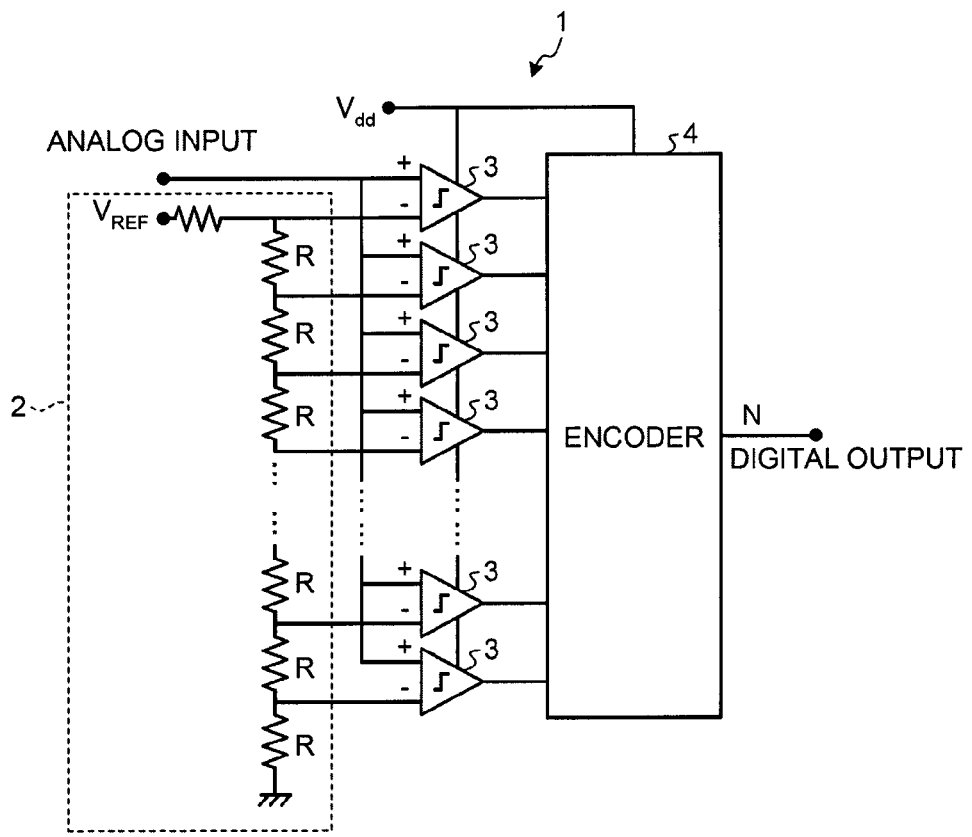
FIG. 1 is a diagram illustrating an AD converter of a parallel comparison type.

An AD converter of the embodiment is an AD converter of a parallel comparison type (flash type). First, the principle and the resolution of an AD converter 1 of the parallel comparison type in FIG. 1 will be described. As illustrated in FIG. 1, the AD converter 1 includes a voltage generating unit 2, a plurality of comparators 3, and an encoder 4. The voltage generating unit 2 includes a plurality of resistors R (a resistor ladder) which are connected in series. The voltage generating unit 2 generates a plurality of comparative voltages by dividing an externally applied reference voltage $V_{REF}$ by the resistor ladder. The plurality of comparative voltages generated by the voltage generating unit 2 is input to the corresponding comparators 3. An analog control signal (an input voltage) is commonly input to the comparators 3. Each of the comparators 3 compares the input comparative voltage with the analog input voltage and outputs a digital signal to the encoder 4 based on the comparison result. The encoder 4 outputs a digital value obtained by encoding the digital signals output from the comparators 3.

The number of the resistors R and the comparators 3 are partially illustrated in FIG. 1, but as the number of the resistors R and the comparators 3 increase, the resolution is improved. In terms of an improvement in the conversion accuracy of the AD converter, the present invention is effective particularly in applying to an AD converter with the resolution of 10 bits or more. However, for the convenience of description, an AD converter with the resolution of a low bit may be described below as an example.

Figure 2:
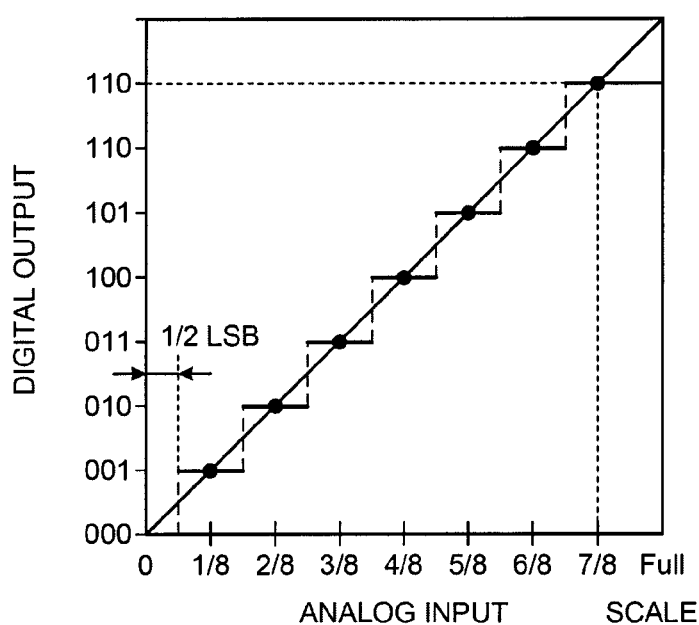
FIG. 2 is a diagram illustrating an I-O characteristic of an AD converter.

An integer value derived from a value obtained by equally dividing the range of the reference voltage $V_{REF}$ (into 256 in case of 8 bits and 1024 in case of 10 bits) is read as an output value (a converted digital value) from the AD converter 1. Further, "$V_{REF}$" or "$\pm V_{REF}$" may be applied as the reference voltage. When "$V_{REF}$" is applied, a value obtained by dividing "$V_{REF}$" by 2N (N represents the number of bits of an output value) (namely, $V_{REF}/2N$) corresponds to the height of one step in a step-like input/output (I/O) characteristic illustrated in FIG. 2 ($2V_{REF}/2N$ when "$\pm V_{REF}$" is applied). In this case, the number of steps is "$2^N-1$". For example, in case of 3 bits, the analog input voltage is divided into $8(=2^3)$, and the number of steps is 7 as illustrated in FIG. 2. Levels of voltages including a zero voltage are output as the digital values. When a minimum voltage unit is used as an LSB (least significant bit), only an LSB has a range of a 1/2 LSB. The LSB originally refers to a least significant digit of a binary number. On the other hand, a most significant digit of a binary number is referred to as an MSB. The AD converter 1 compares the analog input voltage with each of the divided voltages obtained by dividing the reference voltage $V_{REF}$ by the resistor ladder to thereby obtain thermometer codes as outputs of the comparators, and converts the thermometer codes into a binary code through the encoder 4, and outputs the binary code (a digital output).

The accuracy of the AD converter 1 is determined depending on the accuracy of a voltage comparison performed by each comparator 3. For example, in case of 8 bits, an interval between the comparative voltages output from the resistor ladder to which "$\pm V_{REF}=\pm 0.5$ V" is applied is a small value of 4 mV. A maximum value of a step-like voltage error needs to be suppressed to be 2 mV (1/2 LSB) or less. In case of using a CMOS technique, the resistor ladder is generally fabricated on a field (an insulating portion such as $SiO_2$ of a LOCOS or an STI) of an Si substrate using a poly crystalline silicon. In order to increase the processing accuracy, a dummy resistor may be formed at the position close to the resistor ladder. Further, a Joule heat by a resistor may affect a differential non-linear error (DNL) or an integral non-linear error (INL). In order to avoid influence of heat generated from a substrate, there is no problem if a variable resistor is formed not on an FEOL (front end of line) layer of an Si substrate but on a BEOL (back end of line) layer on an interlayer insulating film.

When there is influence of the DNL, the step-like line (a line representing the I/O characteristic) of FIG. 2 is horizontally shifted. An integration of the influence of the DNL results in a form, called the INL, in which all portions undulate in the step form. Typically, the AD converter 1 needs to be fabricated to achieve the high resolution and suppress influence of the DNL and the INL to be a 1/2 LSB or less. Further, the accuracy or stability of the reference voltage $V_{REF}$ has large influence on reliability of a value of the AD converter. Thus, in the embodiment, it is assumed that, for example, a bandgap reference voltage generally used as a reference voltage in a CMOS circuit is used, and the high accuracy in which an error is 1 bit or less is secured for the reference voltage $V_{REF}$.

As described above, the performance of the parallel comparison type AD converter is determined depending on the accuracy of a voltage comparison performed by the comparator. Thus, it is important to increase the accuracy of a voltage comparison performed by the comparator in order to achieve high resolution.

Here, in the parallel comparison type AD converter, when the resolution is set to n bits, ($2^n-1$) comparators are necessary. For example, in case of 8 bits, an interval between voltages output from the resistive ladder to which "$\pm V_{REF}=\pm 0.5$ V" is applied is a small value of 4 mV. A maximum value of a step-like voltage error needs to be suppressed to be 2 mV (1/2 LSB) or less. Here, if a variation in a threshold value is not suppressed to be within 2 mV, it is difficult to properly determine a signal. However, in a differential CMOS comparator designed to have a small area, an offset voltage caused by a variation in a threshold value of a MOS element or a variation in gm is problematic. For example, in a MOS element having a gate insulating film with a thickness of 10 nm, a product (L×W) of a gate length (L) and a width (W), i.e., 256 $\mu^2$ (=16×16 $\mu^2$) is necessary in order to control a variation of 5 mV. A threshold value variation is in inverse proportion to a square root of L x W and can be represented by the following Formula (1):

$$\delta(\Delta Vth)=A/\sqrt{(L\times W)} \tag{1}$$

In Formula (1), $\delta(\Delta Vth)$ represents a threshold value variation. According to Formula (1), a large area in which (L×W) is 1600 $\mu m^2$ (=40×40 $\mu m^2$) is necessary to suppress an offset voltage within 2 mV. An 8-bit AD converter needs 255 comparators, and so the comparators occupy a large area of (1 mm×0.4 mm).

In this regard, the embodiment aims to provide an AD converter with a small circuit size and high conversion accuracy. To this end, a variable resistor having a resistance value variably set according to a control signal is combined with one of two input transistors which are a differential pair of a comparator included in the AD converter. Thus, I-O characteristics of the two input transistors which are the differential pair can be adjusted even after fabrication of the AD converter. A specific description will be made below.

Figure 3:
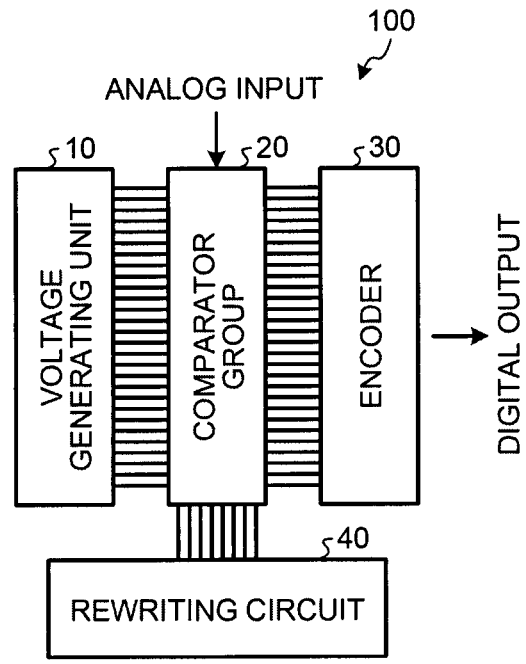
FIG. 3 is a diagram illustrating a schematic configuration example of an AD converter according to an embodiment.

FIG. 3 is a block diagram illustrating a schematic configuration example of an AD converter 100 according to the embodiment. As illustrated in FIG. 3, the AD converter 100 includes a voltage generating unit 10, a comparator group 20, an encoder 30, and a rewriting circuit 40. Here, an example in which the AD converter 100 includes the rewriting circuit 40 will be described, but the AD converter 100 is not limited to this configuration. For example, the AD converter 100 may not include the rewriting circuit 40. In this case, a package chip of the AD converter 100 may include terminals to be connected with the voltage generating unit 10, the comparator group 20, the encoder 30, and the rewriting circuit 40. This allows the AD converter to be connected with the rewriting circuit 40 through the terminals even after the AD converter 100 is fabricated, and thus resistance adjustment which will be described later can be flexibly performed.

Figure 4:
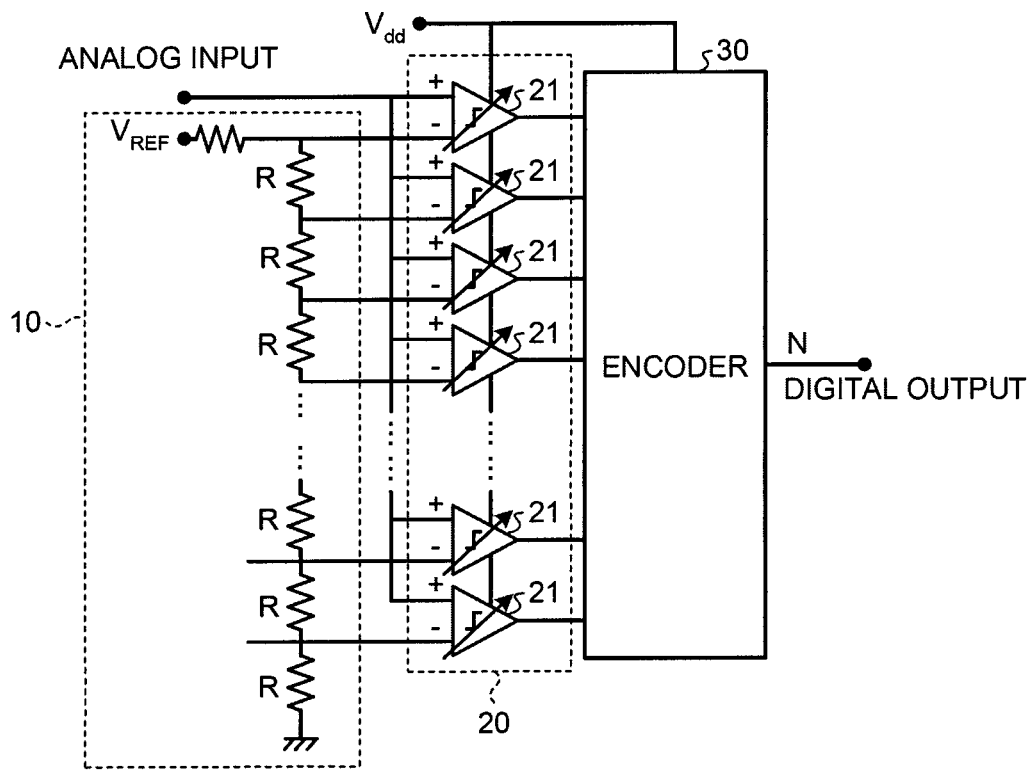
FIG. 4 is a diagram for describing a detailed configuration of the AD converter.

FIG. 4 is a diagram for describing a detailed configuration of the AD converter 100. In FIG. 4, the rewriting circuit 40 is not illustrated. As illustrated in FIG. 4, the voltage generating unit 10 includes a plurality of resistors R which are connected in series. The voltage generating unit 10 divides an externally applied reference voltage $V_{REF}$ by the plurality of resistors R and so generates a plurality of comparative voltages.

The comparator group 20 illustrated in FIG. 3 includes a plurality of comparators 21. A plurality of comparative voltages generated by the voltage generating unit 10 is input to the corresponding comparators 21. An analog control signal (an input voltage) is commonly input to the comparators 21. Each of the comparators 21 compares the input comparative voltage with the analog input voltage, and outputs a digital signal to the encoder 30 based on a result of a comparison between the comparative voltage and the analog input voltage. The encoder 30 outputs a digital value obtained by encoding the digital signals output from the comparators 21. A drive voltage $V_{dd}$ is supplied to the comparators 21 and the encoder 30.

Figure 5:
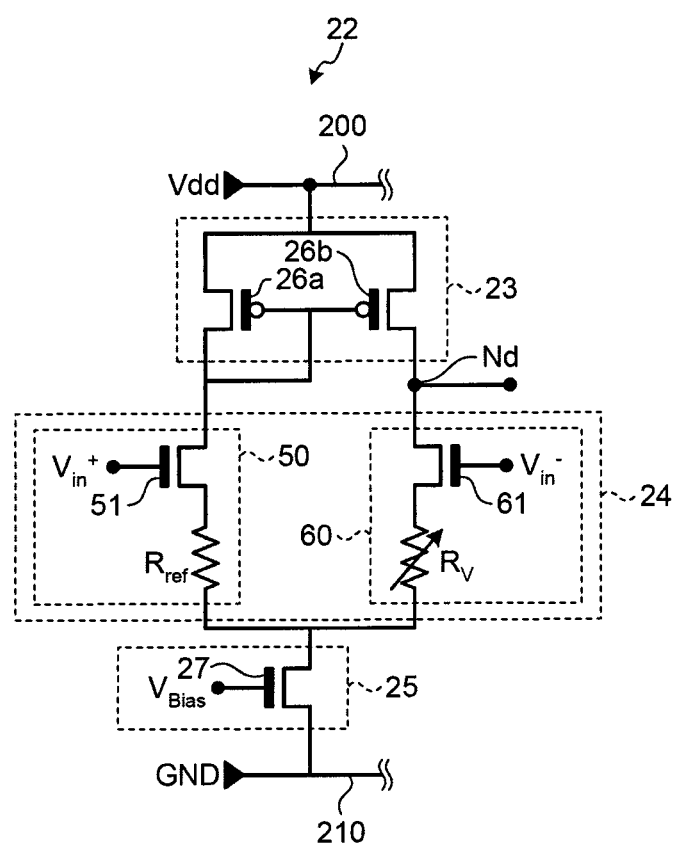
FIG. 5 is a diagram illustrating a configuration example of a differential amplifier.

Next, the principle of a method of adjusting a characteristic of the comparator 21 will be described. Each of the comparators 21 includes a differential amplifier 22 illustrated in FIG. 5. As illustrated in FIG. 5, the differential amplifier 22 is arranged between a power line 200 to which a drive voltage Vdd is supplied and a ground line 210 to which a ground potential GND is supplied. The differential amplifier 22 includes a current mirror portion 23, a differential pair circuit portion 24, and a constant current source 25.

The current mirror portion 23 includes two transistors 26a and 26b, and currents flowing through two transistors 26a and 26b are set to have the same current value. In the embodiment, each of the transistors 26a and 26b is a P channel type field effect transistor (a P-type MOSFET). Gates of the transistors 26a and 26b are connected to each other. Sources of the transistors 26a and 26b are connected to the power line 200 to which the drive voltage Vdd is supplied.

The constant current source 25 is an element for implementing a function for causing a constant current to continuously flow and includes the transistor 27. In the embodiment, the transistor 27 is an N channel type field effect transistor (an N type MOSFET). A source of the transistor 27 is connected to the ground line 210 to which the ground potential GND is supplied. A gate of the transistor 27 receives a bias potential $V_{Bias}$ supplied from the outside. By changing the bias potential $V_{Bias}$ from the outside, a value of a constant current can be variably set.

The differential pair circuit portion 24 is an element for implementing a function for detecting a potential difference between two inputs of the comparative voltage and the analog input voltage, and arranged between the current mirror portion 23 and the constant current source 25. As illustrated in FIG. 5, the differential pair circuit portion 24 includes a first circuit portion 50 and a second circuit portion 60. The first circuit portion 50 includes a first input transistor 51 and a resistor $R_{ref}$. In the embodiment, the first input transistor 51 is an N channel type transistor (an N type MOSFET). One input $V_{in}^+$ is supplied to a gate of the first input transistor 51. Here, an analog input voltage is supplied to the gate of the first input transistor 51 as an example. However, the configuration is not limited thereto. For example, a comparative voltage may be supplied to the gate of the first input transistor 51. A source of the first input transistor 51 is connected with the resistor $R_{ref}$. The resistor $R_{ref}$ is a fixed resistor. In addition, a drain of the first input transistor 51 is connected with a drain of one transistor 26a included in the current mirror portion 23.

The second circuit portion 60 includes a second input transistor 61 and a variable resistor Rv. In the embodiment, the second input transistor 61 is an N channel type transistor (an N type MOSFET). The other input $V_{in}^-$ is supplied to the gate of the second input transistor 61. Here, a comparative voltage is supplied to the gate of the second input transistor 61 as an example. However, the configuration is not limited thereto. For example, an analog input voltage may be supplied to the gate of the second input transistor 61. A source of the second input transistor 61 is connected with the variable resistor Rv. The variable resistor Rv includes a plurality of variable resistive elements each having a resistance value variably set according to a control signal. The details will be described later. Further, a drain of the second input transistor 61 is connected with a drain of the other transistor 26b included in the current mirror portion 23 through a node Nd at which an output Vout of the differential amplifier 22 is output.

A channel type of each transistor included in the differential amplifier 22 is not limited to the example of FIG. 5 but may be arbitrarily changed.

Figure 6:
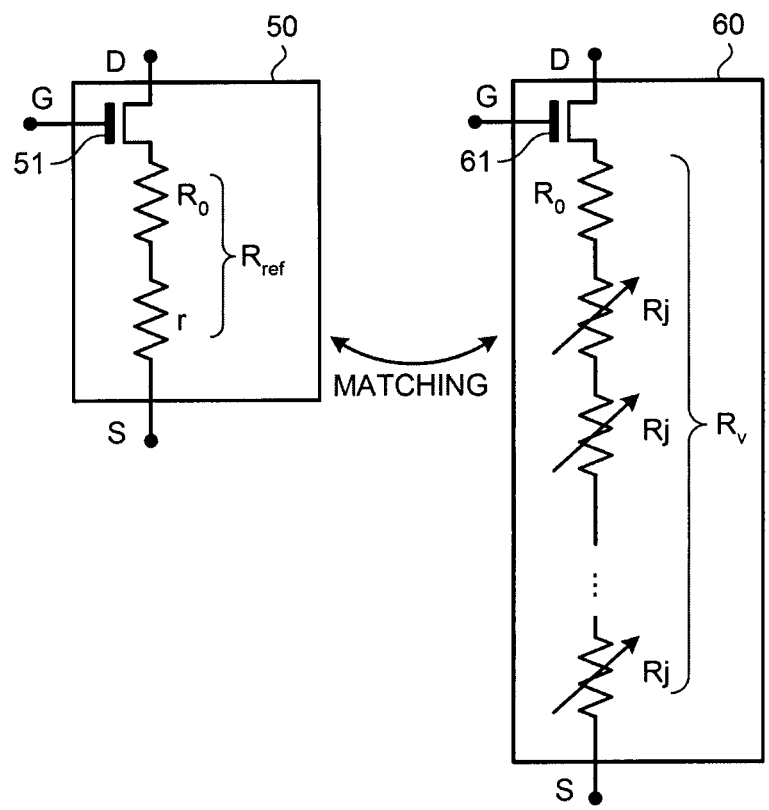
FIG. 6 is a diagram illustrating a detailed configuration example of a first circuit portion and a second circuit portion.

FIG. 6 is a diagram illustrating an example of a detailed configuration of the first circuit portion 50 and the second circuit portion 60. As illustrated in FIG. 6, the resistor $R_{ref}$ of the first circuit portion 50 includes a fixed resistor Ro and a fixed resistor r which are connected in series. The variable resistor Rv of the second circuit portion 60 includes a plurality of variable resistive elements Rj which are connected in series, and each of the variable resistive elements Rj has a resistance value variably set according to a control signal. In the example of FIG. 6, the variable resistor Rv is configured such that the fixed resistor Ro and the plurality of variable resistive elements Rj are connected in series. In the embodiment, by variably setting the resistance value of each of the plurality of variable resistive elements Rj, the whole resistance value of the variable resistor Rv can be set to a desired value.

Figure 7:
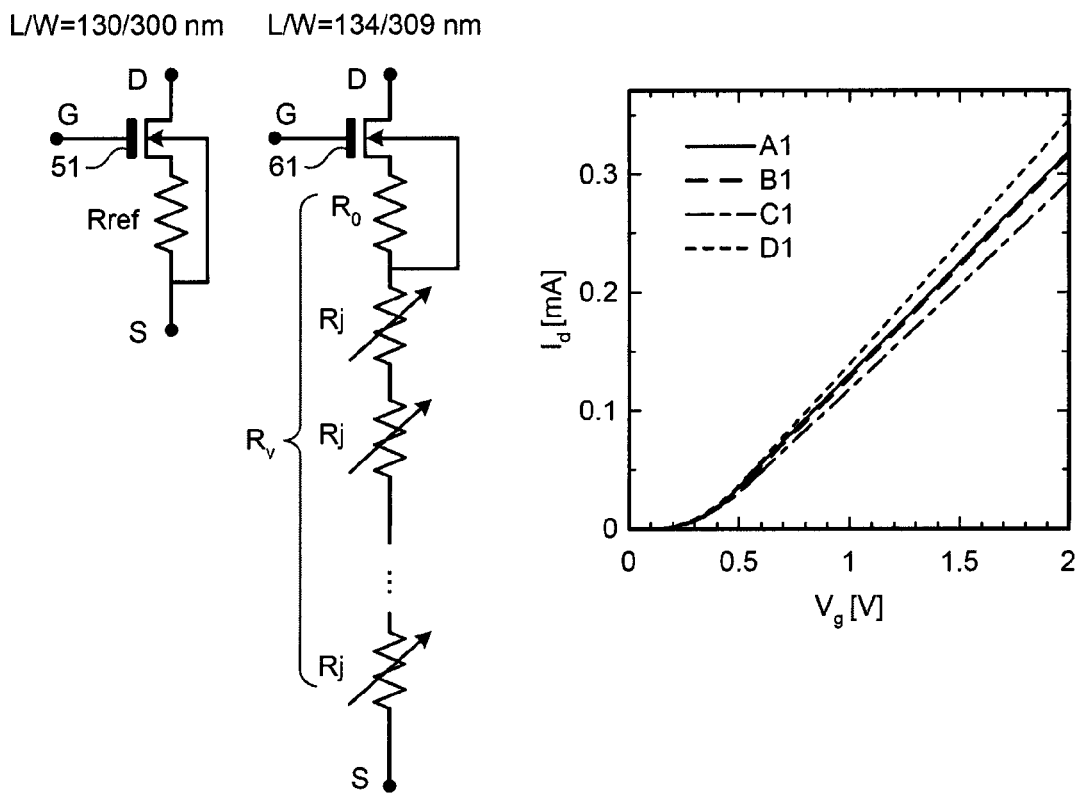
FIG. 7 is a diagram for describing a method of adjusting an I-O characteristic of an input transistor.

For example, it is assumed that about 3% difference in channel length L and channel width W between the first input transistor 51 and the second input transistor 61 occurs as illustrated in FIG. 7. FIG. 7 illustrates an example in which L/W of the first input transistor 51 is 130 nm/300 nm, and L/W of the second input transistor 61 is 134 nm/309 nm. In this case, an I-O characteristic (a relation between a gate potential Vg and a drain current Id flowing between the drain and the source) of the first input transistor 51 is represented by a solid line portion Al of FIG. 7. In order to increase the accuracy of a voltage comparison performed by the comparator 21, it is important to match the I-O characteristics of the first input transistor 51 and the second input transistor 61 that form the differential pair. In theory, it is desirable that the I-O characteristic of the second input transistor 61 is a dotted line portion B1 of FIG. 7. However, in this example, since a manufacturing error of about 3% has occurred as described above, the I-O characteristics of the first input transistor 51 and the second input transistor 61 do not match with each other.

Figure 8:
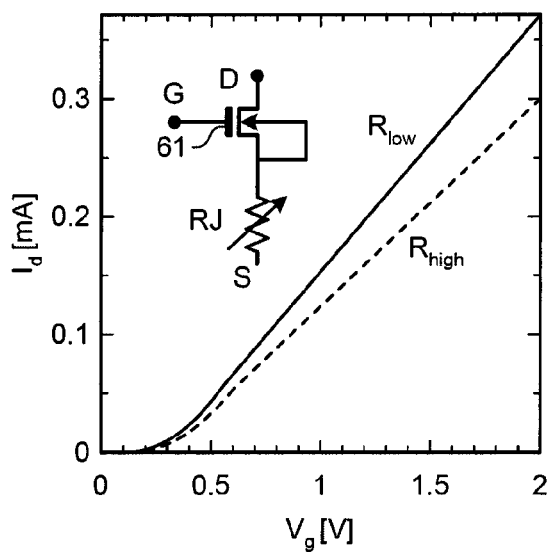
FIG. 8 is a diagram illustrating an example of an I-O characteristic of a second input transistor.

In this regard, in the embodiment, the resistance value of the variable resistor Rv is variably set so that the I-O characteristic of the first input transistor 51 can match with the I-O characteristic of the second input transistor 61. In FIG. 8, a portion of the variable resistor Rv corresponding to the plurality of variable resistive elements Rj which are connected in series is referred to as a variable resistor portion RJ. As illustrated in FIG. 8, the I-O characteristic of the second input transistor 61 changes corresponding to the resistance value of the variable resistor portion RJ. For example, when the resistance value of the variable resistor portion RJ is set from $R_{low}$ to $R_{high}$ ($>R_{low}$), a value of the drain current Id corresponding to the same gate potential Vg is reduced. This is a variable characteristic generated when an effect that a source/drain voltage decreases as the resistance value of the variable resistor Rv increases is combined with an effect that gate potential seems to decrease. On the contrary, when the resistance value of the variable resistor portion RJ is set from $R_{high}$ to $R_{low}$, a value of the drain current Id corresponding to the same gate potential Vg increases. The I-0 characteristic of the second input transistor 61 can be changed by variably setting the resistance value of the variable resistor portion RJ as described above.

Referring back to FIG. 7, a description will be continued. For example, a case in which the I-O characteristic of the second input transistor 61 is an alternate long and short dash line C1 of FIG. 7 is assumed. In this case, by setting the resistance value of each of the plurality of variable resistive elements Rj so that the resistance value of the variable resistor Rv can decrease, the I-O characteristic C1 of the second input transistor 61 can be close to the I-O characteristic B1. Further, for example, a case in which the I-O characteristic of the second input transistor 61 is an alternate long and short dash line D1 of FIG. 7 is assumed. In this case, by setting the resistance value of each of the plurality of variable resistive elements Rj so that the resistance value of the variable resistor Rv can increase, the I-O characteristic D1 of the second input transistor 61 can be close to the I-O characteristic B1. As described above, by variably setting the resistance value of each of the plurality of variable resistive elements Rj so that the I-O characteristic of the first input transistor 51 can match with the I-O characteristic of the second input transistor 61, the accuracy of a voltage comparison performed by the comparator 21 can be increased.

Next, the variable resistive element Rj included in the variable resistor Rv will be described. For example, in the embodiment, the variable resistive element Rj includes a magnetoresistive element. The magnetoresistive element is fabricated through a film forming process and a microfabrication process. The magnetoresistive elements which have the same thin film type are almost the same in sheet resistivity. Here, a magnetic tunnel junction (hereinafter, referred to as "MTJ") element is described as an example of the magnetoresistive element. In the following, the variable resistive element Rj is referred to as an "MTJ element Rj".

Figure 9:
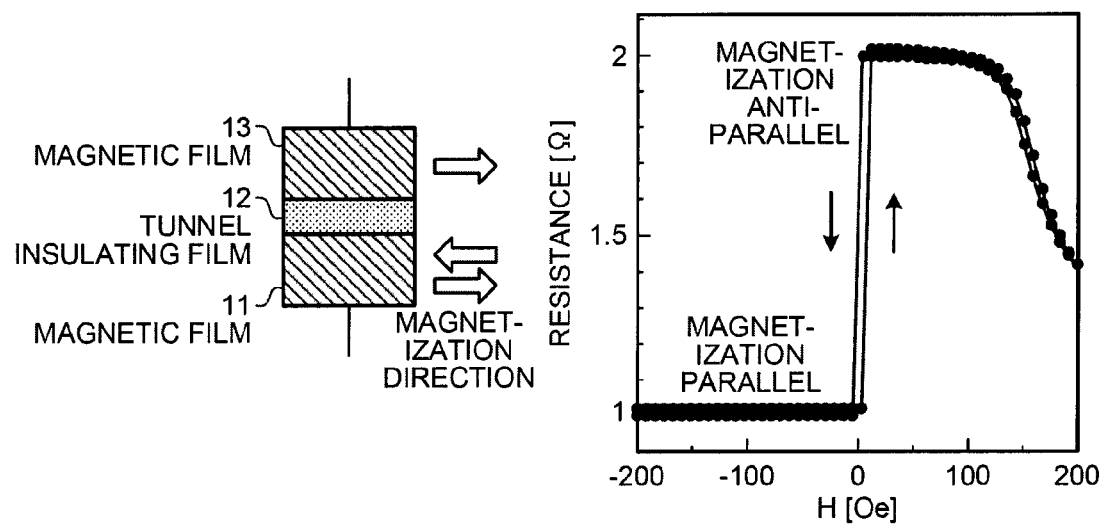
FIG. 9 is a diagram illustrating an exemplary configuration of an MTJ element.

As illustrated in FIG. 9, the MTJ element Rj has a three-layer structure of a magnetic film 11, a tunnel insulating film 12, and a magnetic film 13. For example, CoFeB may be employed as the magnetic film 11, MgO may be employed as the tunnel insulating film 12, and CoFeB may be employed as the magnetic film 13. In the example of FIG. 9, the magnetic film 11 at a lower side is a magnetization free layer in which a magnetization direction is changeable. IrMn which is an antiferromagnetic material is deposited on the magnetic film 13 at an upper side to form a magnetization fixed layer in which a magnetization direction is unchangeable. When the magnetization direction of the magnetization free layer (the magnetic film 11) is the same as the magnetization direction of the magnetization fixed layer (the magnetic film 13) (in case of magnetization parallel), the resistance of the MTJ element Rj changes to a low resistance value as illustrated in FIG. 9. However, when the magnetization direction of the magnetization free layer is opposite to the magnetization direction of the magnetization fixed layer (in case of magnetization antiparallel), the resistance of the MTJ element Rj changes to a high resistance value as illustrated in FIG. 9. As described above, the resistance value of the MTJ element Rj changes to any one of resistance values of two types (a high resistance value and a low resistance value) according to a magnetization state of the MTJ element Rj.

A ratio of a resistance value (a low resistance value) at the time of magnetization parallel and a resistance value (a high resistance value) at the time of magnetization antiparallel is called a magnetic resistance ratio (hereinafter, referred to as an "MR ratio") and defined by the following Formula (2):

$$\text{MR ratio} = (\text{high resistance value} - \text{low resistance value})/(\text{low resistance value}) \quad (2)$$

For example, when the resistance value has changed twice with the change from magnetization parallel to magnetization antiparallel (that is, the high resistance value is twice as large as the low resistance value), the MR ratio becomes 100% ("1"). For example, when the resistance value has changed ten times, the MR ratio becomes 900% ("9"). In case of the MTJ element, an element having the MR ratio of 100% at the room temperature can be easily fabricated.

The film thickness of each of the magnetic film 11, the tunnel insulating film 12, and the magnetic film 13 is set to obtain a desired MR ratio. For example, when the film thickness of CoFeB (the magnetic films 11 and 13) is set to about 3 nm and the film thickness of MgO (the tunnel insulating film 12) is set to about 1 nm, sheet resistance RA of about $10\,\Omega\mu m^2$ and the MR ratio of about 100% are obtained. These values change according to a film forming condition and a subsequent heating process, and so a manufacturer needs to set the conditions in advance. However, the MTJ has a feature that reproducibility of the RA or the MR ratio which is obtained once is very high. As illustrated in FIG. 9, the resistance of the MTJ changes depending on an external magnetic field, and the resistance value clearly has a binary state in case of magnetization parallel and in case of magnetization antiparallel.

A material of the magnetic film is not limited to CoFeB and may include an alloy including Fe, Co, or the like. In order to obtain a desired MR ratio, a highly-spin-polarized material such as a Heusler alloy or oxide magnetic material may be used. The tunnel insulating film is not limited to MgO, and a tunnel insulating film such as AlOx may be used as long as a desired MR ratio is obtained. The type of antiferromagnetic film for magnetization fixing is not limited to IrMn, and the free layer and the fixed layer may be turned upside down. A configuration of an MTJ formed in a known MRAM, an HDD read head, or the like may be employed.

Figure 10:
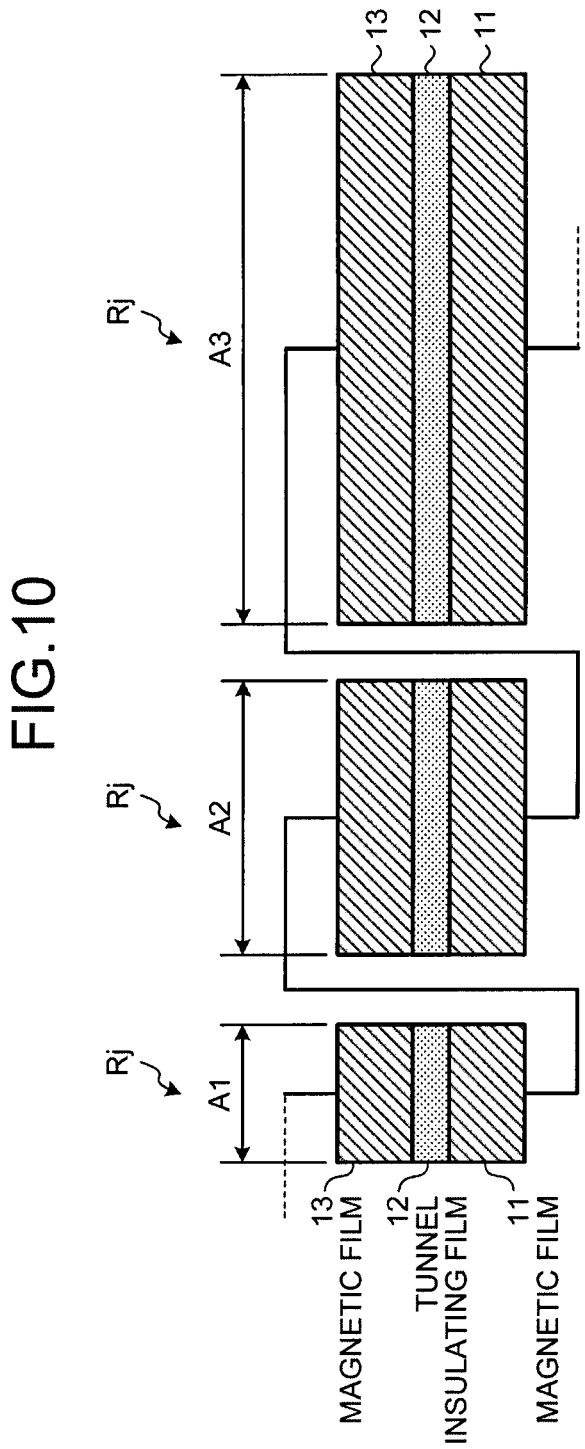
FIG. 10 is a diagram illustrating an example of forming a plurality of MTJ elements.
Figure 11:
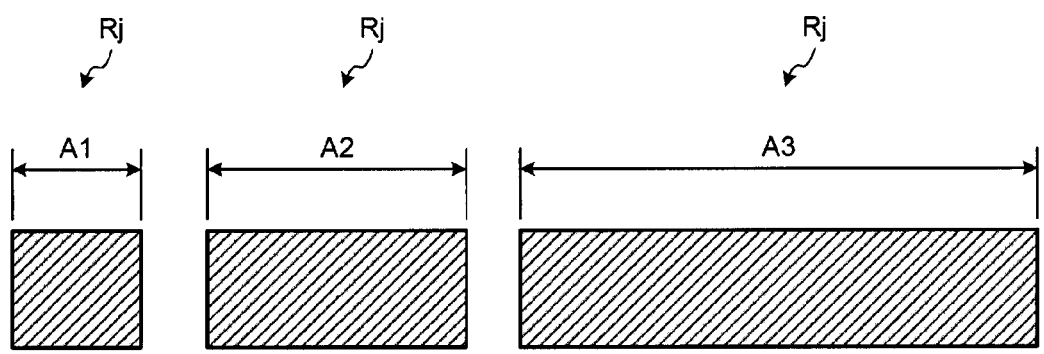
FIG. 11 is a diagram illustrating an example of forming a plurality of MTJ elements.
Figure 12:
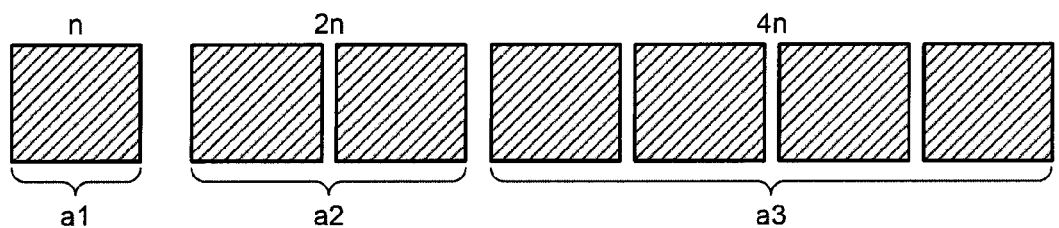
FIG. 12 is a diagram illustrating an example of forming a plurality of MTJ elements.

After deciding the film thickness of each film and performing film formation in the above-described way, a microfabrication process for determining an area size is executed, so that the MTJ elements Rj in serial connection are formed. In an example of FIG. 10, MTJ elements Rj of three types having different sizes A1, A2, and A3 are formed. Each of the MTJ elements Rj is deposited by single film formation. FIG. 11 is a view illustrating a film after processing viewed from the top. In this example, an area of A2 is twice as large as A1, and an area of A3 is four times as large as A1. When the area of A1 is 1, the area of A2 is 2, and the area of A3 is 4. Alternatively, as illustrated in FIG. 12, an area may be defined using the number of a1s using a1 as a unit area. For example, a2 is 2 a1s, and a3 is 4 a1s. In this case, the MTJ elements Rj need not necessarily be close to each other up to the limit and may be arranged to keep a distance not to give influence of processing from each other. In this way, influence of a processing variation or a process damage of an edge portion of the MTJ element Rj can be suppressed.

Figure 13:
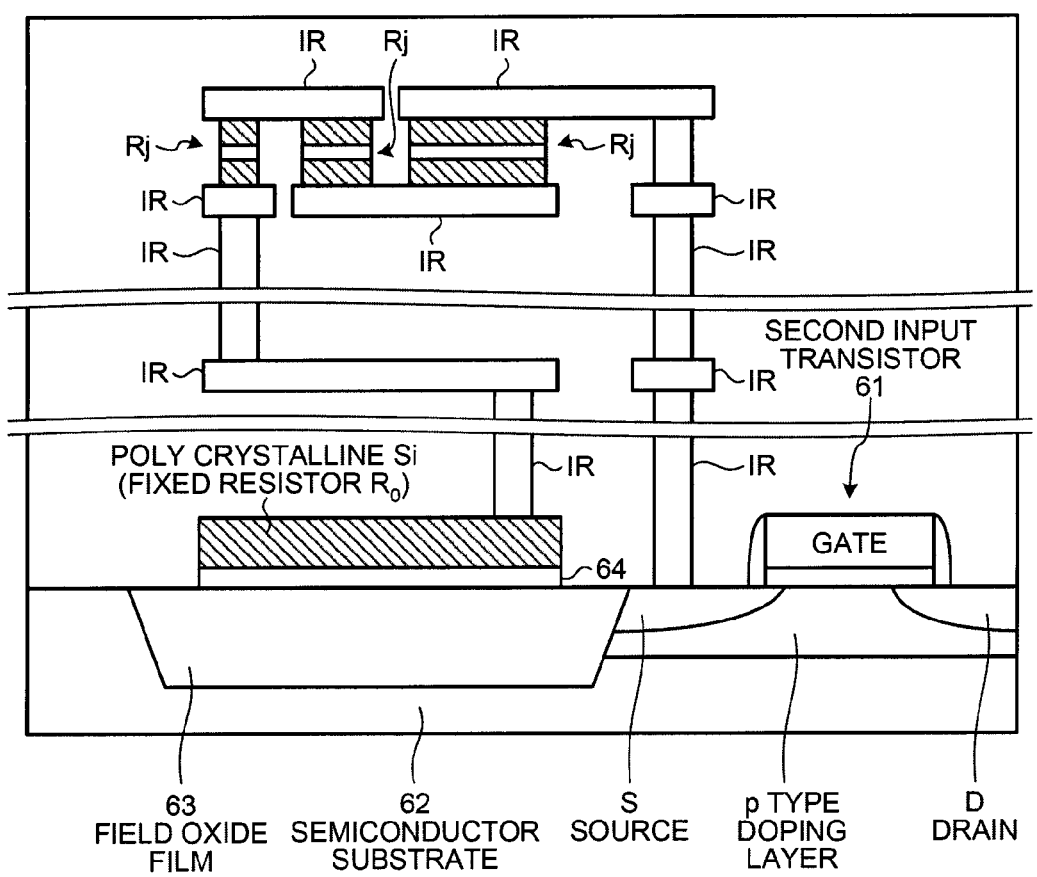
FIG. 13 is a cross-sectional view of the second circuit portion.

The MTJ elements Rj are connected in series by an interconnection forming process before and after forming the MTJ elements Rj. More specifically, the MTJ elements Rj are connected in series through an interconnection wire IR as illustrated in FIG. 13. In this way, a plurality of MTJ elements Rj which have different areas and are connected in series are formed.

FIG. 13 is a cross-sectional view of the second circuit portion 60 (see FIG. 6) when three MTJ elements (variable resistive element) Rj are included in the variable resistor Rv. As illustrated in FIG. 13, the second input transistor 61 is formed on the semiconductor substrate 62 made of silicon. Further, poly crystalline Si is formed above the field oxide film 63 for separating an element, which is formed in the semiconductor substrate 62, through the insulating layer 64 interposed therebetween. The poly crystalline Si corresponds to the fixed resistor Ro of FIG. 6. As illustrated in FIG. 13, the source electrode S (corresponding to S of FIG. 6) of the second input transistor 61 is connected to the MTJ element Rj or the poly crystalline Si through the interconnection layer IR. Further, in the example of FIG. 13, a plurality of MTJ elements Rj which are connected in series are formed to overlap over an area of the semiconductor substrate 62 where the poly crystalline Si is formed.

In the example of FIG. 13, each film (the magnetic film and the tunnel insulating film) constituting each of the MTJ elements Rj is formed by patterning the same layer. For example, in connection with two MTJ elements Rj, the magnetic film of one MTJ element Rj and the magnetic film of the other MTJ element Rj are formed by patterning the same layer, and the tunnel insulating film of one MTJ element Rj and the tunnel insulating film of the other MTJ element Rj are formed by patterning the same layer. However, the configuration is not limited thereto. For example, each film (the magnetic film and the tunnel insulating film) constituting each of the MTJ elements Rj may be different layers. That is, a plurality of MTJ elements Rj may be sequentially stacked in a height direction (may have a vertically stacked structure).

Next, a method of adjusting a resistance value of the variable resistors Rv will be described. The rewriting circuit 40 illustrated in FIG. 3 variably sets a resistance value of each variable resistor Rv of each comparator 21 according to an external signal. In the present embodiment, when a magnetic field generated due to a current flowing through a corresponding signal line is applied to the MTJ element Rj included in the variable resistors Rv, a magnetization state of the MTJ element Rj changes (the resistance value changes). The rewriting circuit 40 variably sets the resistance value of the MTJ element Rj by controlling a current flowing through the signal line according to an external signal. A more specific description will be made below.

Figure 14:
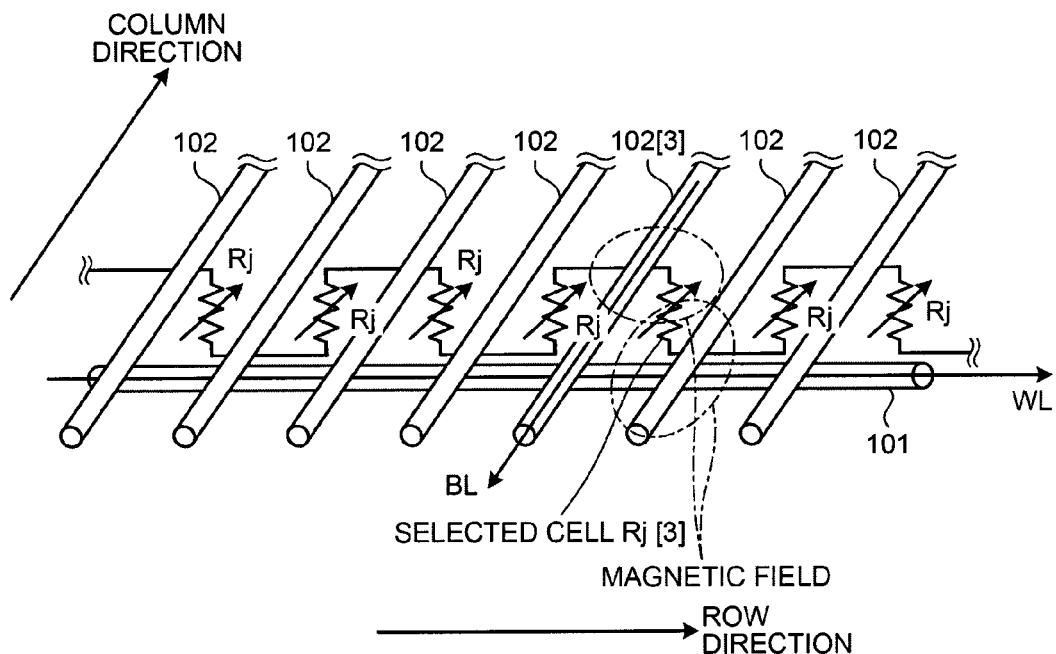
FIG. 14 is a diagram for describing an example of a method of changing a magnetization state of the MTJ element.

Here, an example in which each variable resistor Rv includes seven MTJ elements Rj which are connected in series will be described. A description will be made in connection with one variable resistor Rv with reference to FIG. 14. FIG. 14 illustrates one variable resistor Rv, but the remaining variable resistors Rv have the same configuration. In the example of FIG. 14, the seven MTJ elements Rj included in one variable resistor Rv are formed corresponding to crossing points of a word line 101 extending in a row direction and a plurality of bit lines 102 extending in a column direction in parallel.

The rewriting circuit 40 changes the magnetization state of each MTJ element Rj by controlling a current (controlling a direction or a value of a current) flowing through the word line 101 and the bit line 102 according to an external signal. In this example, when a magnetic field (a magnetic field externally leaking from the word line 101 and the bit line 102) generated due to the current flowing through the word line 101 and the bit line 102 is applied to the MTJ element Rj, the magnetization state of the MTJ element Rj changes.

Further, an arrangement of a signal line for applying a magnetic field to the MTJ element Rj is not limited to the example of FIG. 14. For example, each of seven MTJ elements Rj may be formed corresponding to each of crossing points of one bit line 102 and a plurality of word lines 101 which extend in a row direction in parallel. In other words, it is sufficient if each MTJ element Rj is arranged near the word line 101 and the bit line 102 corresponding to the MTJ element Rj in question, and the magnetization state of the MTJ element Rj in question may be variably controlled when the magnetic field generated due to the current flowing through the word line 101 and the bit line 102 corresponding to the MTJ element Rj in question is applied to the MTJ element Rj in question.

In the example of FIG. 14, a magnetic field for resetting is externally applied to each MTJ element Rj in advance, and so each MTJ element Rj is set (reset) to the magnetization parallel state. For the MTJ element Rj for which "magnetization antiparallel" is designated by the input external signal (which will be described later), the rewriting circuit 40 performs control such that a predetermined current flows to each of the word line 101 and the bit line 102 corresponding to the MTJ element Rj. For example, in FIG. 14, when "magnetization antiparallel" is designated as a magnetization state of a third MTJ element Rj [3] from the right, the rewriting circuit 40 performs control such that a predetermined current flows to each of the word line 101 and the bit line 102 [3] of the third column from the right as illustrated in FIG. 14. At this time, the magnetic field (synthetic magnetic field) generated due to the current flowing through the word line 101 and the bit line 102 [3] of the third column is applied to the MTJ element Rj [3], and so the magnetization state of the MTJ element Rj [3] changes from magnetization parallel to magnetization antiparallel.

The above-described embodiment is an example, and an arbitrary method may be used to change the magnetization state of the MTJ element Rj to the magnetization parallel state or the magnetization antiparallel state. For example, the rewriting circuit 40 may reset (individually reset) the magnetization state of each MTJ element Rj to the magnetization parallel state by individually controlling the current flowing through the word line 101 and the bit line 102 without applying a magnetic field for resetting from the outside.

The external signal input to the rewriting circuit 40 includes a plurality of control signals that correspond to the plurality of comparator 21 in a one-to-one manner. Each of the control signals is represented by a plurality of bits that correspond to the plurality of MTJ elements Rj included in the variable resistors Rv of the corresponding comparator 21 in a one-to-one manner. Each of the MTJ elements Rj is set to any one of resistance values (a high resistance value and a low resistance value) of two types according to a bit corresponding to the corresponding MTJ element Rj.

Figure 15:
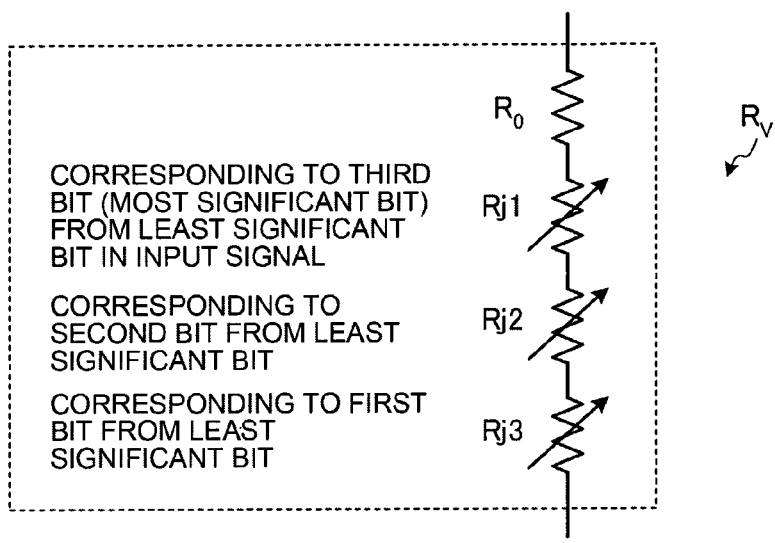
FIG. 15 is a diagram illustrating an example of a variable resistor.

Now, an example in which one variable resistors Rv includes three MTJ elements Rj1 to Rj3 which are connected in series as illustrated in FIG. 15 will be described. In the example of FIG. 15, it is assumed that the size of the MTJ element Rj1 (an area value of a film) is A1, the size of the MTJ element Rj2 is A2, and the size of the MTJ element Rj3 is A3. Since the resistance value is in inverse proportion to the area value, when the MTJ elements Rj1 and Rj2 are in the same magnetization state, the resistance value of the MTJ element Rj1 is twice as large as the resistance value of the MTJ element Rj2. Further, the resistance value of the MTJ element Rj1 is four times as large as the resistance value of the MTJ element Rj3.

The control signal corresponding to the variable resistor Rv illustrated in FIG. 15 is represented by 3 bits, a third bit from a least significant bit (a most significant bit) corresponds to the MTJ element Rj1 having the largest resistance value. Further, a second bit from a least significant bit corresponds to the MTJ element Rj2 having the second largest resistance value. Further, a first bit from a least significant bit corresponds to the MTJ element Rj3 having the smallest resistance value.

According to the control signal of 3 bits corresponding to the variable resistor Rv of FIG. 15, the rewriting circuit 40 variably sets the resistance value of the variable resistors Rv. In the example of FIG. 15, when a bit corresponding to the MTJ element Rj is "1", since "magnetization antiparallel" is designated as the magnetization state of the MTJ element Rj, the rewriting circuit 40 controls the current flowing through the word line 101 and the bit line 102 such that the magnetization state of the MTJ element Rj changes to magnetization antiparallel. As a result, the resistance value of the MTJ element Rj is set to a high resistance value. When a bit corresponding to the MTJ element Rj is "0", since "magnetization parallel" is designated as the magnetization state of the MTJ element Rj, the rewriting circuit 40 controls the current flowing through the word line 101 and the bit line 102 such that the magnetization state of the MTJ element Rj changes to magnetization parallel. As a result, the resistance value of the MTJ element Rj is set to a low resistance value. However, the embodiment is not limited to this example. For example, when a bit corresponding to the MTJ element Rj is "1", "magnetization parallel" may be designated as the magnetization state of the MTJ element Rj, whereas when a bit corresponding to the MTJ element Rj is "0", "magnetization antiparallel" may be designated as the magnetization state of the MTJ element Rj. In other words, there is no problem if each MTJ element Rj is set to any one of resistance values of two types (a high resistance value and a low resistance value) according to the bit corresponding to the MTJ element Rj.

A resistance value of a portion (a variable resistor portion RJ) in which a plurality of MTJ elements Rj are connected in series in the variable resistor Rv of FIG. 15 is represented by the following Formula (3):

$$\text{Resistance value} = Rp \times \Sigma(1 + MR \text{ ratio} \times aj) \times 2^N \quad (3)$$

In Formula (3), Rp represents sheet resistance in case of magnetization parallel. Further, aj represents a magnetization state of an MTJ element Rj corresponding to an i-th bit (in this example, $1 \leq j \leq 3$) from a least significant bit. aj is set to "0" in case of magnetization parallel but to "1" in case of magnetization antiparallel. N (in this example, $0 \leq N \leq 2$) represents a bit position (weight). For example, it is assumed that Rp is 1 Ω per unit area, the MR ratio is 100%, and the control signal corresponding to the variable resistors Rv of FIG. 15 is "101". In this case, the rewriting circuit 40 controls the current flowing the word line 101 and the bit line 102 such that the magnetization state of the MTJ element Rj1 becomes "magnetization antiparallel," the magnetization state of the MTJ element Rj2 becomes "magnetization parallel," and the magnetization state of the MTJ element Rj3 becomes "magnetization antiparallel". The resistance value of the portion in which a plurality of MTJ elements Rj are connected in series in the variable resistors Rv of FIG. 15 becomes 12Ω (=1× $\{(1+100\% \times 1) \times 2^2 + (1+100\% \times 0) \times 2^1 + (1+100\% \times 1) \times 2^0\}$).

Figures 16, 17:
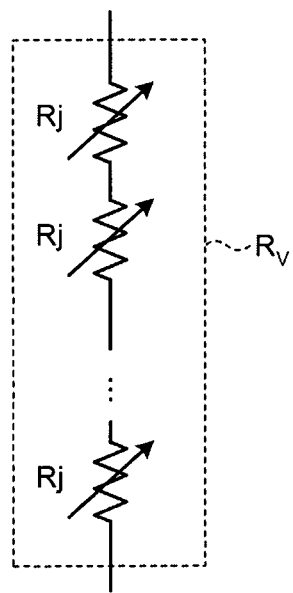
FIG. 16 is a diagram illustrating an example of a correspondence relation between a control signal and a resistance value.
FIG. 17 is a diagram illustrating a modification of a variable resistor.

As described above, the resistance value of the portion in which a plurality of MTJ elements Rj are connected in series in the variable resistor Rv of FIG. 15 is variably set according to the control signal of 3 bits. FIG. 16 is a diagram illustrating a correspondence relation between the control signal of 3 bits and the resistance value of the portion in which a plurality of MTJ elements Rj are connected in series in the variable resistor Rv. In this example, by adjusting the control signal of 3 bits, the resistance value of the portion in which a plurality of MTJ elements Rj are connected in series in the variable resistor Rv can be adjusted in a stepwise manner.

Here, the example in which three MTJ elements (variable resistive elements) Rj is included in the variable resistor Rv has been described. However, the number of MTJ elements Rj included in the variable resistor Rv is not limited thereto but may be determined according to the resolution of the AD converter 100 desired to manufacture. For example, a case is assumed in which, in order to achieve 1.1 kΩ as the resistance value of the variable resistor Rv, poly crystalline silicon (the fixed resistor Ro) of 1 kΩ is combined with a plurality of variable resistive elements Rj whose total resistance value is set to 1 Ω. In this case, even if it is found that poly crystalline silicon has a processing variation of 1% and the variable resistor Rv has the resistance value of 999 Ω after fabrication, by setting the control signal so that the resistance value of the plurality of variable resistive elements Rj can change from 1Ω to 2Ω, the total resistance value of the variable resistor Rv can be set to 1.1 kΩ.

As described above, in the embodiment, one (the second input transistor 61) of the two input transistors (the first input transistor 51 and the second input transistor 61) which is the differential pair of the comparator 21 included in the AD converter 100 is combined with the variable resistor Rv having a resistance value variably set according to the control signal. By adjusting the control signal even after fabrication of the AD converter 100, it is possible to variably set the resistance value of the variable resistor Rv so that the I-O characteristics of the two input transistors can match with each other. Thus, the voltage dividing accuracy by the comparator 21 can be improved without setting the channel length L and the channel width W to large values in order to suppress a variation in the I-O characteristics of the two input transistors. Accordingly, the conversion accuracy of the AD converter 100 can be improved while suppressing an increase in the circuit size.

Further, in the embodiment, the films forming the plurality of individual MTJ elements Rj included in the variable resistor Rv are different in the area value (different in the resistance value). Thus, compared to a case where the films forming a plurality of individual MTJ elements Rj included in the variable resistor Rv are set to have the same area value, there is an advantage that the resistance value of the variable resistor Rv can be adjusted in a more stepwise manner.

Next, modifications will be described. The modifications described below may be arbitrarily combined.

(1) First Modification

In the above-described embodiment, each variable resistor Rv includes the fixed resistor Ro and a plurality of variable resistive elements Rj which are connected in series, but the invention is not limited thereto. For example, the variable resistor Rv may not include the fixed resistor Ro as illustrated in FIG. 17. In other words, there is no problem if each if the variable resistors Rv includes a plurality of variable resistive elements Rj which are connected in series, and each of the variable resistive elements Rj has a resistance value variably set according to the control signal.

Figure 18:
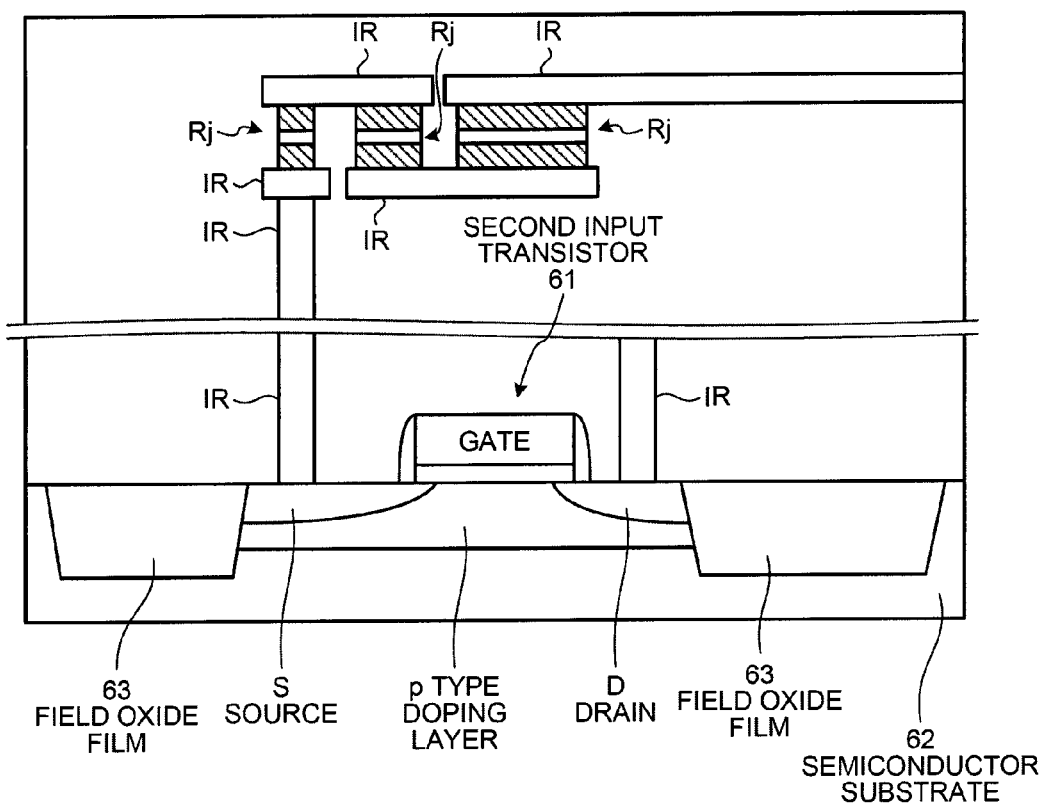
FIG. 18 is a cross-sectional view of a second circuit portion according to a modification.

FIG. 18 is a cross-sectional view of the second circuit portion 60 when the variable resistor Rv includes three MTJ elements (variable resistive elements) Rj which are connected in series without including the fixed resistor Ro. Unlike FIG. 13, the poly crystalline Si (the fixed resistor Ro) is not formed above the semiconductor substrate 62. A plurality of MTJ elements Rj are arranged to overlap over an area of the semiconductor substrate 62 where the second input transistor 61 is formed. The source electrode S of the second input transistor 61 is connected with the MTJ element Rj through the interconnection layer IR.

(2) Second Modification

In the above-described embodiment, the example in which the variable resistive element Rj is an MTJ element has been described, but the invention is not limited thereto. For example, the variable resistive element Rj may be a GMR (giant magneto resistance) element. The GMR element is different from the MTJ element in that a non-magnetic film is used instead of the tunnel insulating film. In other words, the GMR element has a three-layer structure of a magnetic film, a non-magnetic film, and a magnetic film. For example, Co may be employed as the magnetic film, and Cu may be employed as the non-magnetic film. A material of the magnetic film is not limited to Co, but a magnetic film made of a general alloy containing Fe or Co or a high spin polarized material such as a Heusler alloy or oxide magnetic material may be used. A material of the non-magnetic film is not limited to Cu, and for example, Ag, Cr, or the like may be employed. That is, a configuration of a GMR element formed in a conventional HDD read head or the like may be employed.

Meanwhile, the MTJ element has a non-linear I-V characteristic as illustrated in FIG. 19 since the tunnel current flows. On the other hand, the GMR element has a linear I-V characteristic as illustrated in FIG. 20. In the above-described embodiment, since the two or more MTJ elements are connected in series, a divided voltage applied to one MTJ element is reduced and so non-linearity is mitigated. However, for example, when the analog input signal has a high frequency and so non-linearity of the I-V characteristic becomes problematic, it is desirable to use the GMR element instead of the MTJ element. As a result, the linear I-V characteristic of FIG. 20 is obtained. Further, since the MJT element utilizes the tunnel resistance, an absolute value of the resistance value thereof depends on the thickness of the tunnel insulating film in an exponential manner. On the other hand, the GMR element in which each layer is formed of a metallic film can easily obtain a low resistance. However, since the GMR element is smaller in the MR ratio than the MTJ element, the MR ratio needs to be increased using a magnetic thin film having a high spin polarization ratio such as a Heusler alloy.

In other words, the type of magnetoresistive element used as the variable resistive element Rj is arbitrary. Using a magnetoresistive element whose resistance value changes to any of two values according to the magnetization state like the MTJ element or the GMR element, digital control for variably controlling the resistance value of the variable resistor Rv can be implemented.

(3) Third Modification

Figure 21:
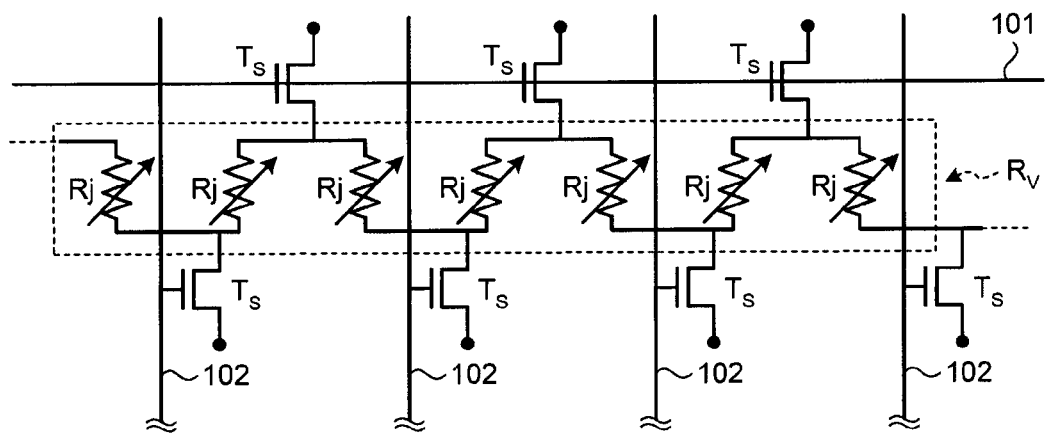
FIG. 21 is a diagram for describing a case in which a spin injection magnetization reversal technique is employed.

A method of variably controlling the magnetization state of the MTJ element (the magnetoresistive element) is arbitrary. For example, a spin-injection magnetization reversal technique may be used that changes the magnetization state of the MTJ element by controlling a magnitude or a direction of a current supplied to the MTJ element. When the spin-injection magnetization reversal technique is employed, selective transistors Ts for selectively supplying a current to the MTJ elements are provided as illustrated in FIG. 21. In the example of FIG. 21, a plurality of variable resistive elements Rj included in one variable resistor Rv are illustrated, but the fixed resistor Ro is not illustrated. Another variable resistor Rv has the same configuration. The rewriting circuit 40 controls on/off of each of the selective transistors Ts according to a control signal corresponding to the variable resistor Rv of FIG. 21, and the magnetization state (resistance value) of the MTJ element Rj changes according to the current supplied through the selective transistor Ts which is switched to an on state. A more specific description will be made below.

Figure 22:
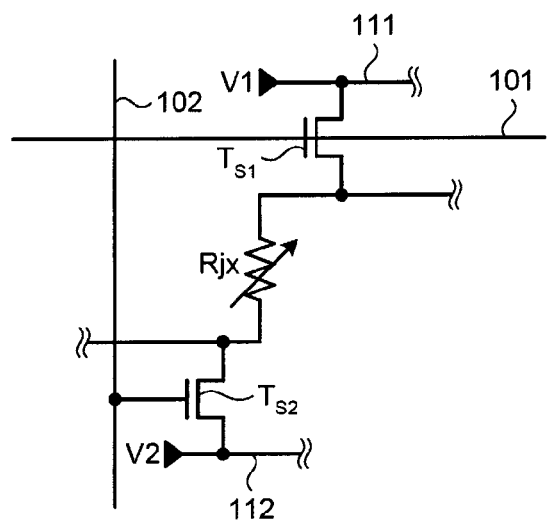
FIG. 22 is a diagram for describing a specific MTJ element.

Next, a description will be made in connection with a specific MTJ element Rjx as illustrated in FIG. 22. As illustrated in FIG. 22, a first selective transistor Ts1, a specific MTJ element Rjx, and a second selective transistor Ts2 are connected in series between a first power line 111 to which first potential V1 is applied and a second power line 112 to which second potential V2 is applied. The first selective transistor Ts1 is arranged between the first power line 111 and the MTJ element Rjx. A gate of the first selective transistor Ts1 is connected to a word line 101 corresponding to the MTJ element Rjx. The second selective transistor Ts2 is arranged between the second power line 112 and the MTJ element Rjx. A gate of the second selective transistor Ts2 is connected to a bit line 102 corresponding to the MTJ element Rjx. In other words, the selective transistors Ts are means for performing switching whether to supply a current from the power lines (111 and 112) to the MTJ element Rjx.

The rewriting circuit 40 (not illustrated) changes magnetization state of the MTJ element Rjx by controlling supply of the current to the MTJ element Rjx. For example, it is assumed that a current of a predetermined magnitude flowing from the first power line 111 to the second power line 112 is supplied to the MTJ element Rjx. In this case, the rewriting circuit 40 first selects a word line 101 and a bit line 102 corresponding to the MTJ element Rjx. As a result, the first selective transistor Ts1 and the second selective transistor Ts2 transit to the on state, and so a current path from the first power line 111 to the second power line 112 through the MTJ element Rjx is formed. The rewriting circuit 40 then sets values of the first potential V1 and the second potential V2 so that the current of the predetermined magnitude can flow from the first power line 111 to the second power line 112 (in this case, V1>V2). As a result, the current of the predetermined magnitude flowing from the first power line 111 to the second power line 112 is supplied to the MTJ element Rjx, and so the magnetization state of the MTJ element Rjx changes according to the current.

Further, for example, it is assumed that a current of a predetermined magnitude flowing from the second power line 112 to the first power line 111 is supplied to the MTJ element Rjx. In this case, the rewriting circuit 40 first selects a word line 101 and a bit line 102 corresponding to the MTJ element Rjx. The rewriting circuit 40 then sets values of the first potential V1 and the second potential V2 so that the current of the predetermined magnitude can flow from the second power line 112 to the first power line 111 (in this case, V2>V1). As a result, the current of the predetermined magnitude flowing from the second power line 112 to the first power line 111 is supplied to the MTJ element Rjx, and so the magnetization state of the MTJ element Rjx changes according to the current.

For example, when "magnetization antiparallel" is designated as the magnetization state of the MTJ element Rjx according to the control signal corresponding to the variable resistor Rv of FIG. 21, the rewriting circuit 40 controls on/off of the first selective transistor Ts1 and the second selective transistor Ts2 and controls the potential of the first power line 111 and the second power line 112 such that the magnetization state of the MTJ element Rjx changes to "magnetization antiparallel". Further, for example, when "magnetization parallel" is designated as the magnetization state of the MTJ element Rjx according to the control signal, the rewriting circuit 40 controls on/off of the first selective transistor Ts1 and the second selective transistor Ts2 and controls the potentials of the first power line 111 and the second power line 112 such that the magnetization state of the MTJ element Rjx changes to "magnetization parallel". Here, the specific MTJ element Rjx has been described as an example, but this embodiment is similarly applied to another MTJ element Rj. The configuration of FIGS. 21 and 22 is an example, and the connection method of the word line 101 or the bit line 102 is not limited thereto. In other words, there is no problem if a configuration is employed in which the magnetization state of the MTJ element Rj is variably set by selectively supplying the current to the MTJ element Rj.

(4) Fourth Modification

Figure 23:
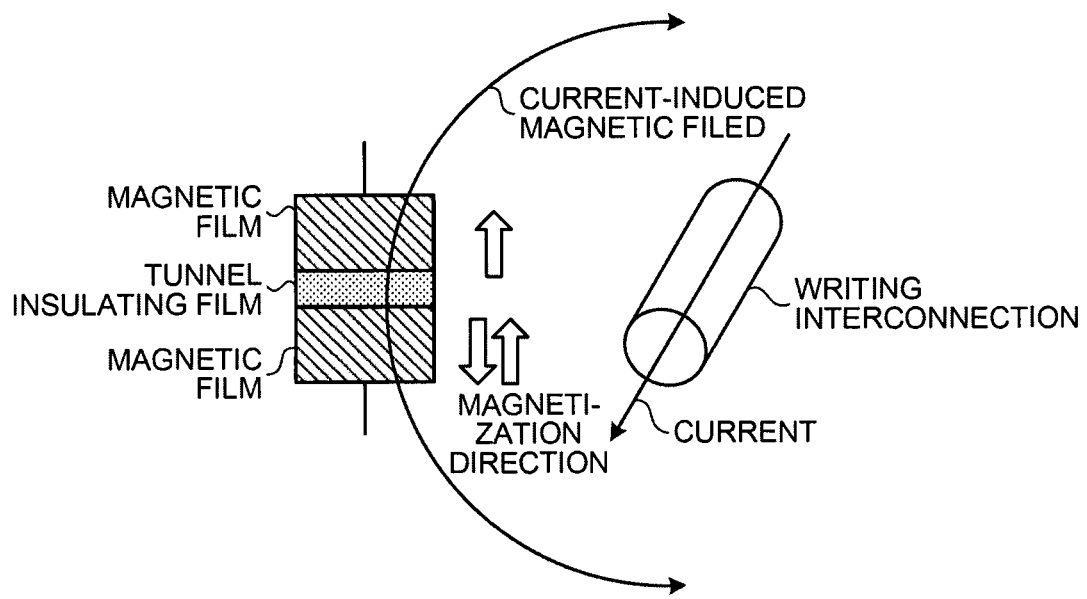
FIG. 23 is a diagram illustrating a modification of an MTJ element.

Any magnetic film may be included in the MTJ element. For example, a thin film having vertical magnetization may be used as the magnetic film as illustrated in FIG. 23. In this case, a vertical film in which Co or Fe contains Pt or Pd may be employed as the magnetic film, and a vertical film containing Gd, Tb, or the like may be employed as the magnetic film. As a method of variably controlling the magnetization state, a method may be employed in which the magnetization state of the MTJ element is changed by varying a magnitude or a direction of a current flowing through a write line arranged near the MTJ element as illustrated in FIG. 23. That is, by applying a magnetic field (a magnetic field externally leaking from the write interconnection) generated due to the current flowing through the writ line to the MTJ element, it is possible to change the magnetization state of the MTJ element. The configuration is not limited thereto, and for example, the magnetization state of the MTJ element can be varied by the above-described spin injection magnetization reversal technique.

(5) Fifth Modification

In the above-described embodiment, films forming a plurality of individual MTJ elements Rj included in the variable resistor Rv are different in the area value (different in the resistance value). However, the invention is not limited thereto, and films forming a plurality of individual MTJ elements Rj included in the variable resistor Rv may be set to have the same area value. However, when a configuration is employed in which films forming a plurality of individual MTJ elements Rj included in the variable resistor Rv are different in the area value as in the above-described embodiment, the resistance value of the variable resistor Rv can be adjusted in a more stepwise manner compared to a configuration in which films forming a plurality of individual MTJ elements Rj is set to have the same area value.

(6) Sixth Modification

In the above-described embodiment, the variable resistor Rv is connected to the source side of the second input transistor 61 (see FIG. 6), but the invention is not limited thereto. For example, the variable resistor Rv may be connected to the drain side of the second input transistor 61. In this configuration, the I-0 characteristic of the second input transistor 61 changes corresponding to the resistance value of the variable resistor Rv. For example, when the resistance value of the variable resistor Rv is set from R1 to R2 (>R1), a value of the drain current Id corresponding to the same gate potential Vg decreases. This is a variable characteristic generated from decrease of the source/drain voltage with increase of the resistance value of the variable resistor Rv connected to the drain side. However, compared to a case in which the variable resistor Rv is connected to the source side of the second input transistor 61, a degree of change (an adjustment width) in the I-0 characteristic is small.

(7) Seventh Modification

Figure 24:
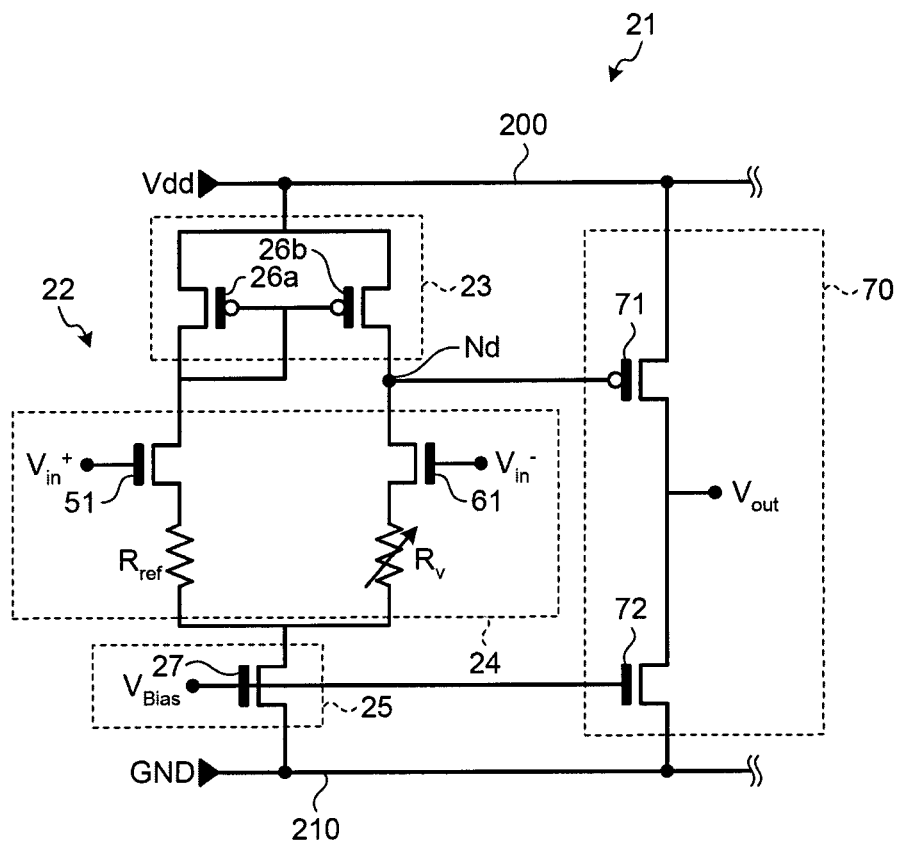
FIG. 24 is a diagram illustrating a modification of a comparator.

There is no problem if each comparator 21 compares the input comparative voltage with the analog input voltage and then outputs the digital signal based on the comparison result, and the configuration of the comparator 21 can be arbitrarily changed. For example, the comparator 21 may be configured such that the differential amplifier 22 of FIG. 5 as a preceding stage is combined with an output circuit 70 for increasing a gain and drive capability as a subsequent stage as illustrated in FIG. 24. As illustrated in FIG. 24, the output circuit 70 includes a transistor 71 and a transistor 72 which are connected in series between the power line 200 and the ground line 210. The transistor 72 functions as a current source. In the example of FIG. 24, the transistor 72 is an N channel field effect transistor (an N type MOSFET). A bias potential $V_{Bias}$ is supplied to a gate of the transistor 72 from the outside. One electrode of the transistor 71 is connected to a drain of the transistor 72. The transistor 71 is an N channel field effect transistor (an N type MOSFET). A gate of the transistor 71 is connected to the node Nd. A source of the transistor 71 is connected to the power line 200, a drain of the transistor 71 is connected to a drain of the transistor 72. In the example of FIG. 24, an output of the differential amplifier 22 is amplified and then output by the transistor 71.

Figure 25:
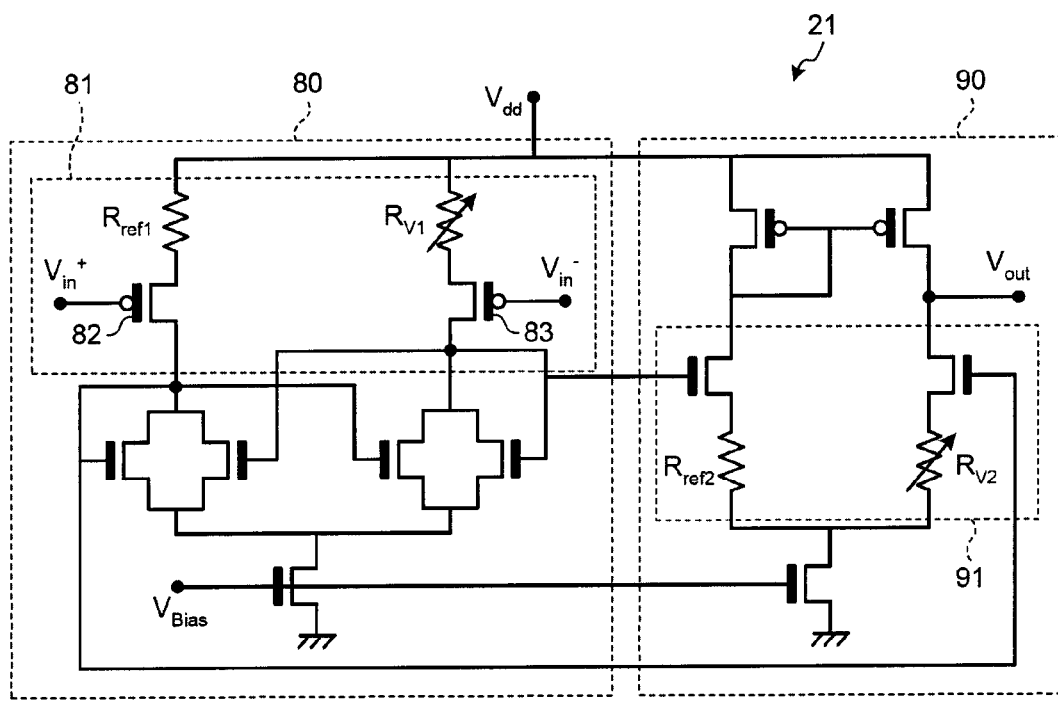
FIG. 25 is a diagram illustrating a modification of a comparator.

Alternatively, for example, as illustrated in FIG. 25, the comparator 21 may be configured such that a fully differential comparator 80 as a preceding stage is combined with a differential comparator 90 as a subsequent stage. As illustrated in FIG. 25, the comparator 80 includes a differential pair circuit portion 81, and the comparator 90 includes the differential pair circuit portion 91. The differential pair circuit portion 81 of the comparator 80 is different from the above embodiment in that each of a first input transistor 82 and a second input transistor 83 is a P channel type field effect transistor (a P type MOSFET). In this example, the two input transistors are of the P channel type, but similarly to the above-described embodiment, a resistor $R_{ref1}$ is connected to a source side of the first input transistor 82, and a variable resistor Rv1 is connected to a source side of the second input transistor 83. The configuration of the variable resistor Rv1 is the same as that of the above-described variable resistor Rv. The differential pair circuit portion 91 of the comparator 90 has the same configuration as in the above-described embodiment.

(8) Eighth Modification

The above embodiment has been described in connection with the example in which the MTJ element which is a magnetoresistive element is used as an example of the variable resistive element Rj included in the variable resistor Rv. However, the invention is not limited thereto, and the type of an element employed as the variable resistive element Rj is arbitrary. In other words, there is no problem if each of the plurality of variable resistors Rv includes a plurality of variable resistive elements Rj which are connected in series, and each of the variable resistive elements has a resistance value variably set according to a control signal. And there is no problem if the control signal corresponding to the variable resistor Rv is represented by a plurality of bits which correspond to a plurality of variable resistive elements Rj included in the variable resistor Rv in a one-to-one manner and each variable resistive element Rj is set to any one of resistance values of two types according to a bit corresponding to the variable resistive element Rj.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An analog-to-digital converter, comprising:
   a voltage generating unit configured to divide an externally applied reference voltage by a plurality of resistors to generate a plurality of comparative voltages; and
   a plurality of comparators each configured to compare any one of the plurality of comparative voltages with an analog input voltage and output a digital signal based on a result of a comparison between the comparative voltage and the analog input voltage,
   wherein each of the plurality of comparators includes a differential pair circuit configured to detect a potential difference between two inputs of the comparative voltage and the analog input voltage,
   the differential pair circuit includes a first circuit portion and a second circuit portion,
   the first circuit portion includes:
      a first input transistor having a gate to which one input is supplied; and
      a resistor which is connected in series with the first input transistor,
   the second circuit portion includes:
      a second input transistor that has a gate to which the other input is supplied and forms a differential pair with the first input transistor; and
      a variable resistor which is connected in series with the second input transistor, and
   the variable resistor includes a plurality of variable resistive elements which are connected in series, and each of the variable resistive elements has a resistance value variably set according to a control signal.

2. The converter according to claim 1,
   wherein a resistance value of each of the plurality of variable resistive elements is set so that an I-O characteristic of the first input transistor matches with an I-O characteristic of the second input transistor.

3. The converter according to claim 1,
   wherein the control signal is represented by a plurality of bits that correspond to the plurality of variable resistive elements in a one-to-one manner, and
   each of the plurality of variable resistive elements is set to any one of resistance values of two types according to the bit corresponding to the corresponding variable resistive element.

4. The converter according to claim 3,
   wherein the plurality of variable resistive elements comprises films, each film having a different value.

5. The converter according to claim 3,
   wherein the variable resistive element is a magnetoresistive element.

6. The converter according to claim 5,
   wherein the magnetoresistive element is a magnetic tunnel junction element.

7. The converter according to claim 5,
   wherein the magnetoresistive element is a GMR element.

8. The converter according to claim 5, further comprising a rewriting circuit configured to variably set a resistance value of the magnetoresistive element according to the control signal,
   wherein a magnetization state of the magnetoresistive element changes when a magnetic field generated by a current flowing through a corresponding signal line is applied to the magnetoresistive element, so that a resistance value of the magnetoresistive element changes, and
   the rewriting circuit controls the current flowing through the signal line according to the control signal.

9. The converter according to claim 5, further comprising:
   a rewriting circuit configured to variably set a resistance value of the magnetoresistive element according to the control signal; and
   a selective transistor configured to perform switching whether to supply a current from a power line to the magnetoresistive element,
   wherein a magnetization state of the magnetoresistive element changes with a current supplied through the selective transistor that is switched to an on state, so that the resistance value of the magnetoresistive element changes, and
   the rewriting circuit controls on/off of the selective transistor according to the control signal.

* * * * *